United States Patent [19]

Nakamura et al.

[11] Patent Number: 4,617,488

[45] Date of Patent: Oct. 14, 1986

[54] COMPOSITE PIEZOELECTRIC VIBRATOR WITH TRAPEZOIDAL CROSS SECTION

[75] Inventors: Takeshi Nakamura, Uji; Ikuo Matsumoto, Nagaokakyo, both of Japan

[73] Assignee: Murata Manufacturing Co., Ltd., Nagaokakyo, Japan

[21] Appl. No.: 761,395

[22] Filed: Aug. 1, 1985

[30] Foreign Application Priority Data

Aug. 10, 1984 [JP] Japan .................................. 59-168677

[51] Int. Cl.⁴ ............................................ H01L 41/08
[52] U.S. Cl. ..................................... 310/321; 310/348
[58] Field of Search ................ 310/311, 321, 322, 324, 310/367, 368, 344, 348

[56] References Cited

U.S. PATENT DOCUMENTS 4,293,986 10/1981 Kobayashi et al. .............. 310/370 X
4,469,975 9/1984 Nakamura et al. .................. 310/321

Primary Examiner—Mark O. Budd
Attorney, Agent, or Firm—Wenderoth, Lind & Ponack

[57] ABSTRACT

A piezoelectric vibrator capable of vibrating in an expansion mode of vibration comprising a piezoelectric vibrating element, composed of a vibrateable substrate, made of a constant elastic metal, a thin film of piezoelectric material and an exciting electrode layer. The substrate has a generally trapezoidal cross-sectional representation, as viewed in a direction perpendicular to the direction of propagation of vibrations, with one of the opposite surfaces thereof adjacent the thin film being greater than the other of said opposite surfaces.

2 Claims, 8 Drawing Figures

COMPOSITE PIEZOELECTRIC VIBRATOR WITH TRAPEZOIDAL CROSS SECTION

BACKGROUND OF THE INVENTION

The present invention relates to a piezoelectric vibrator capable of vibrating in an expansion mode of vibration and, more particularly, to the vibrator comprising a piezoelectric vibrating element composed of a vibrateable substrate, made of a constant elastic metal, i.e., a metallic material having a constant modulus of elasticity, a thin film of piezoelectric material and an exciting electrode layer.

In the piezoelectric vibrator of the type referred to above, it is generally well known that some vibrating characteristics of the vibrator such as, for example, the capacity ratio $\gamma(=C_D/C_O)$ and the difference $\Delta F$ between the resonance and anti-resonance frequencies can be improved if the thickness of the vibrateable substrate is small. However, the reduced thickness of the vibrateable substrate often constitutes a cause of reduction in physical strength and/or of warp which would occur in the vibrateable substrate during the formation of the piezoelectric thin film thereon by the use of a sputtering technique. Therefore, the extent to which the vibrateable substrate can be reduced in thickness has been limited.

In view of the limitation imposed on the capability of reducing the thickness of the vibrateable substrate, countermeasures have hitherto been employed in such a way as to render the vibrateable substrate to have, instead of the square shape, a generally rectangular shape as shown in FIG. 5(a), a shape generally similar to a tie bow as shown in FIG. 5(b), or a shape generally similar to a butterfly as shown in FIG. 5(c), or any other shape modified from the shape shown in any one of FIGS. 5(a) to 5(c).

However, it has been found that, even though the shape of the vibrateable substrate is carefully designed and chosen, the vibrating characteristics cannot be improved so much as expected, and therefore, demand has been made to provide an effective resort to achieve it.

SUMMARY OF THE INVENTION

The present invention has been developed with a view to substantially eliminating the problems inherent in the prior art piezoelectric vibrator and has for its essential object to provide an improved version capable of exhibiting the improved vibrating characteristics.

In order to accomplish this object, in accordance with the present invention, the vibrateable substrate employed in the piezoelectric vibrator of the type referred to hereinbefore is so designed and so shaped as to have a generally trapezoidal cross-sectional representation as viewed in a direction perpendicular to the direction of propagation of vibration in the substrate such that one of the opposite planar surfaces of the substrate having the piezoelectric thin film formed thereon has a width larger than the other of the opposite planar surfaces thereof.

With the vibrateable substrate so designed as hereinabove described according to the present invention, such vibrating characteristics of the piezoelectric vibrator as the capacity ratio and the difference between the resonance and anti-resonance frequencies can be satisfactorily and effectively improved. More specifically, according to the present invention, the capacity ratio can be so reduced as to facilitate oscillation, making it possible to easily fabricate an oscillating circuit with the use of the piezoelectric vibrator of the present invention. In addition, the difference between the resonance and anti-resonance frequencies can be increased so that, when the piezoelectric vibrator is used as a VCO oscillating element, the lock range can be widened and an oscillating element may have a rough initial precision, but have a quick response.

BRIEF DESCRIPTION OF THE DRAWINGS

This and other objects and features of the present invention will become clear from the following description taken in conjunction with a preferred embodiment thereof with reference to the accompanying drawings, in which.

DETAILED DESCRIPTION OF THE EMBODIMENT

Figure 1:
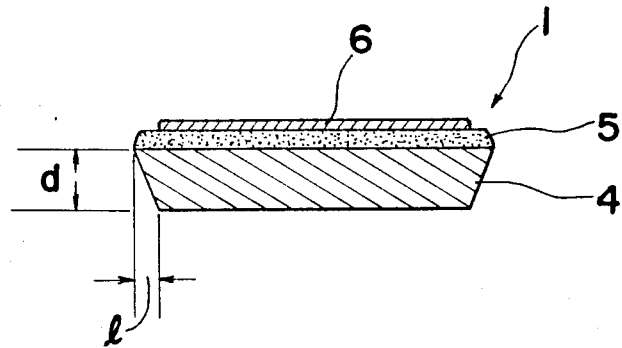
FIG. 1 is a sectional view of a piezoelectric vibrating element of the piezoelectric vibrator according to the present invention.
Figure 2:
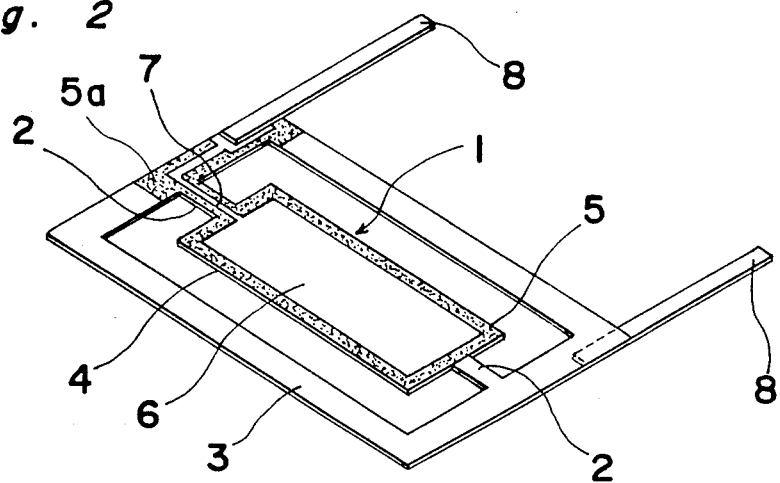
FIG. 2 is a perspective view of the piezoelectric element with a casing removed.
Figure 3:
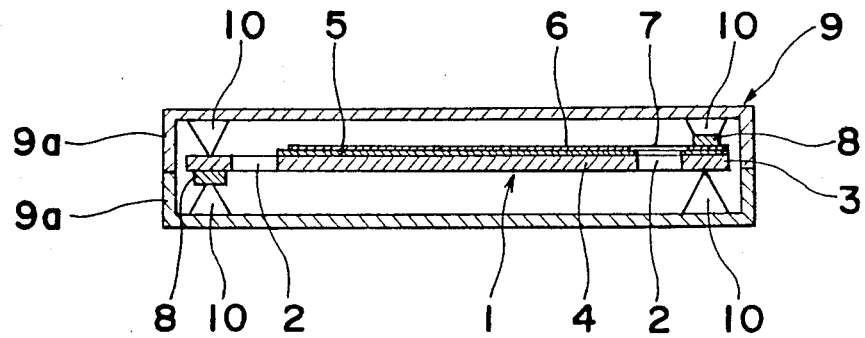
FIG. 3 is a transverse sectional view of the piezoelectric vibrator.

Referring to the accompanying drawings, particularly to FIGS. 1 to 3, a piezoelectric vibrator embodying the present invention comprises a generally rectangular box-like casing 9 composed of substantially identical casing halves 9a each having a generally rectangular plate and a peripheral wall protruding from the rectangular periphery of the respective plate at right angles thereto.

A generally rectangular piezoelectric vibrating element 1 is supported by a similarly shaped frame member 3 by means of a pair of connecting strips 2 protruding from the opposite ends of the vibrating element 1 in the opposite directions away from said element 1, respectively, said connecting strips 2 being in line with each other and also with the longitudinal axis of the vibrating element 1. This vibrating element 1 comprises a vibrateable substrate 1 having one planar surface deposited with a thin film 5 of piezoelectric material, for example, ZnO, by the use of any known sputtering technique, and an exciting electrode layer 6 deposited on one surface of the piezolelectric thin film 5 opposite to the substrate 4 by the use of any known vapor deposition technique, said electrode layer 6 being preferably made of Al, Ag, Au or Ni.

The connecting strips 2, the frame member 3 and the vibrateable substrate 4 are of unitary structure formed by the use of any suitable method, for example, a press work, of a constant elastic metallic material having a constant modulus of elasticity such as, for example, Elinvar, Invar, Anver, or Co-elinvar.

At the time of the deposition of the piezoelectric thin film 5 on the substrate 4, an extension 5a of the piezoelectric thin film 5 is also formed so as to extend from the thin film 5 along one of the connecting strips 2 and terminate at one of the four corner areas of the frame member 3. Similarly, at the time of deposition of the electrode layer 6, an extension of the electrode layer 6 is formed so as to extend from the electrode layer 6 along said one of the connecting strips 2 and over the extension 5a of the thin film 5 and terminate at said one of the corner areas of the frame member 3 thereby defining a lead-out electrode 7. Two elongated terminal members 8 for electrical connection of the piezoelectric vibrator with an external circuit are rigidly connected, for example, soldered to the free end of the lead-out electrode 7 and one of the other corner areas of the frame member 3.

As best shown in FIG. 1, the vibrateable substrate 4 has a generally trapezoidal cross-sectional representation, as viewed in a direction perpendicular to the direction of propagation of vibrations, with one of the opposite surfaces thereof adjacent the piezoelectric thin film 5 being greater in width than the other of the opposite surfaces thereof. This unique cross-sectional shape can be formed by the use of an etching technique wherein etching maskings of different patterns are employed for the respective, opposite surfaces of the substrate 4.

In the illustrated embodiment, the vibrateable substrate 4 has a thickness d of, for example, 100 micrometers, in which case a length of a value equal to half the difference between the respective widths of the opposite surfaces of the vibrateable substrate 4 is chosen to be, for example, 40 micrometers.

The assembly, i.e., the unitary structure of substrate 4, connecting strips 2 and frame member 3 with the piezoelectric thin film 5 and electrode layer 6, is encased within the casing 9 as shown in FIG. 3. As shown, each of the casing halves 9a has four conical projections 10 protruding inwardly from the respective rectangular plate at respective location corresponding to the four corner areas of the frame member 3 such that, within the interior of the casing 9, the assembly can be supported by a point support system while the four corner areas of the frame member 3 are sandwiched between tips of the respectively paired conical projections 10. The casing halves 9a are bonded together to provide the casing 1 with the assembly therein in any suitable manner.

Results of experiments conducted to evaluate the vibrating characteristics will now be described with particular reference to FIGS. 4(a) and 4(b).

Figure 4:
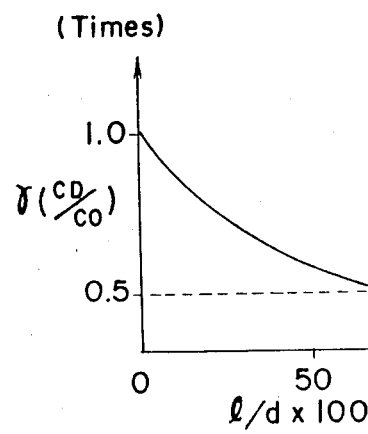
FIG. 4(a) is a graph showing the relationship between the capacity ratio and the length.
FIG. 4(b) is a graph showing the relationship between the frequency difference $\Delta F$ and the length.
Figure 4:
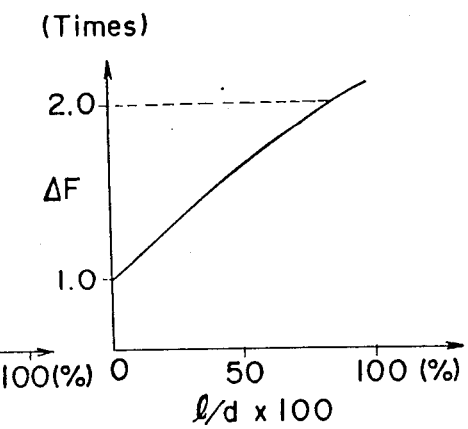

FIG. 4(a) illustrates the change in capacity ratio $\gamma(=C_P/C_O)$ with change in ratio l/d of the length l relative to the thickness d shown in FIG. 1, whereas FIG. 4(b) illustrates the change in difference $\Delta F$ between the resonance and anti-resonance frequencies with change in ratio l/d.

From the graphs of FIGS. 4(a) and 4(b), it is clear that the greater the ratio l/d, the smaller the ratio $\gamma$ and the greater the frequency $\Delta F$. Thus, according to the present invention, the piezoelectric vibrator is effective to exhibit the improved vibrating characteristics. If the percentage of the ratio l/d is selected to be 10% or higher, the capacity ratio $\gamma$ can be reduced by a factor of 0.9 or smaller and the frequency difference $\Delta F$ can be increased by a factor of 1.1 or greater, and accordingly, the percentage of the ratio l/d is preferred to be 10% or higher.

Figure 5A:
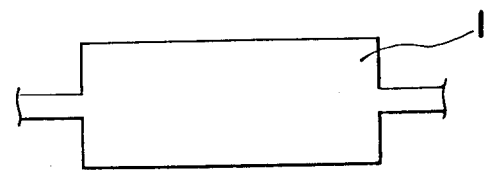
FIGS. 5(a) to 5(c) are top plan views of the prior art piezoelectric elements showing the respective shapes thereof.
Figure 5B:
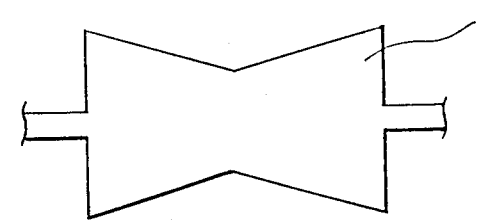
Figure 5C:
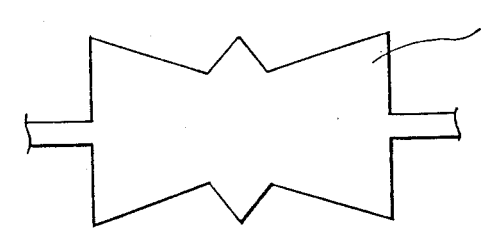

Although the present invention has been fully described in connection with the preferred embodiment thereof with reference to the accompanying drawings, it is to be noted that various changes and modifications are apparent to those skilled in the art. By way of example, the concept of the present invention can be equally applicable to the substrate having a square shape or such a shape as shown in any one of FIGS. 5(a) to 5(c).

Accordingly, such changes and modifications are to be understood as included within the scope of the present invention unless they depart therefrom.

What is claimed is:

1. In a piezoelectric vibrator capable of vibrating in an expansion mode of vibration comprising a piezoelectric vibrating element, composed of a vibrateable substrate, made of a constant elastic metal, a thin film of piezoelectric material and an exciting electrode layer, the improvement wherein the substrate has a generally trapezoidal cross-sectional representation, as viewed in a direction perpendicular to the direction of propagation of vibrations, with one of the opposite surfaces thereof adjacent the thin film being greater than the other of said opposite surfaces.

2. A piezoelectric vibrator as claimed in claim 1, wherein, in the cross-sectional representation, the length of a value equal to 0.5 times the difference between respective widths of the opposite surfaces of the vibrateable substrate is selected to be 10% or greater than the thickness of the substrate.

* * * * *